United States Patent
Tsai et al.

(10) Patent No.: US 9,391,239 B2
(45) Date of Patent: Jul. 12, 2016

(54) LIGHT EMITTING DIODE

(71) Applicant: Industrial Technology Research Institute, Hsinchu (TW)

(72) Inventors: Yao-Jun Tsai, Taoyuan County (TW); Chen-Peng Hsu, Hsinchu (TW); Shih-Yi Wen, Taipei (TW); Chi-Chin Yang, Taichung (TW); Yu-Hsiang Chang, Hsinchu (TW); Re-Ching Lin, Taichung (TW); Hung-Lieh Hu, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 98 days.

(21) Appl. No.: 14/166,864

(22) Filed: Jan. 29, 2014

(65) Prior Publication Data

US 2014/0231851 A1   Aug. 21, 2014

(30) Foreign Application Priority Data

Feb. 4, 2013   (TW) .............................. 102104245 A

(51) Int. Cl.
*H01L 33/40* (2010.01)
*H01L 33/20* (2010.01)
(Continued)

(52) U.S. Cl.
CPC ............ *H01L 33/405* (2013.01); *H01L 33/385* (2013.01); *H01L 33/20* (2013.01);
(Continued)

(58) Field of Classification Search
CPC combination set(s) only.
See application file for complete search history.

(56) References Cited

U.S. PATENT DOCUMENTS

| 7,256,483 B2 | 8/2007 | Epler et al. |
| 7,329,905 B2 | 2/2008 | Ibbetson et al. |

(Continued)

FOREIGN PATENT DOCUMENTS

| CN | 102792471 | 11/2012 |
| JP | 2008130875 | 6/2008 |

(Continued)

OTHER PUBLICATIONS

"High Thermal Dissipation of Light Emitting Diodes by Integrating Thin Film Process and Packaging Technology", Author(s): Y.J. Tsai et al., Published in: Microsystems, Packaging, Assembly and Circuits Technology Conference (IMPACT), 2011 6th International, Oct. 19-20, 2011, p. 492-p. 494.

(Continued)

*Primary Examiner* — Mohammad Islam
*Assistant Examiner* — Ratisha Mehta
(74) *Attorney, Agent, or Firm* — Jianq Chyun IP Office

(57) ABSTRACT

A light emitting diode includes a semiconductor stacked structure, a substrate, a first electrode, a second electrode and a third electrode. The semiconductor stacked structure includes a first semiconductor layer, a second semiconductor layer and a light emitting layer. The first semiconductor layer has a first surface and a second surface opposite to each other and has a first region and a second region. The second semiconductor layer is disposed on the second surface. The light emitting layer is disposed between the first semiconductor layer and the second semiconductor layer. The substrate has a first conductive layer and a second conductive layer thereon. The first electrode is disposed between the second semiconductor layer and the first conductive layer. The second electrode is disposed on the first surface. The third electrode is disposed between the second region and the second conductive layer, and electrically connected to the second electrode.

19 Claims, 19 Drawing Sheets

(51) Int. Cl.
  *H01L 33/38* (2010.01)
  *H01L 33/48* (2010.01)
  *H01L 33/62* (2010.01)

(52) U.S. Cl.
  CPC .............. *H01L 33/38* (2013.01); *H01L 33/382* (2013.01); *H01L 33/486* (2013.01); *H01L 33/62* (2013.01); *H01L 2924/0002* (2013.01)

(56) References Cited

U.S. PATENT DOCUMENTS

| | | | |
|---|---|---|---|
| 7,875,533 B2 | 1/2011 | Epler et al. | |
| 8,193,541 B2 | 6/2012 | Tsai et al. | |
| 2005/0253161 A1 | 11/2005 | Horio et al. | |
| 2006/0033113 A1* | 2/2006 | Lee | H01L 33/46 257/80 |
| 2006/0081869 A1 | 4/2006 | Lu et al. | |
| 2010/0163895 A1 | 7/2010 | Horie | |
| 2011/0241056 A1 | 10/2011 | David et al. | |
| 2011/0278620 A1 | 11/2011 | Yoo | |
| 2011/0291143 A1* | 12/2011 | Kim | H01L 33/56 257/98 |
| 2013/0099198 A1* | 4/2013 | Tanaka | H01L 33/38 257/13 |

FOREIGN PATENT DOCUMENTS

| | | |
|---|---|---|
| TW | 595015 | 6/2004 |
| TW | 200629605 | 8/2006 |
| TW | 201032349 | 9/2010 |

OTHER PUBLICATIONS

"GaN/Mirror/Si Light-Emitting Diodes for Vertical Current Injection by Laser Lift-Off and Wafer Bonding Techniques", Dong-Sing Wuu et al., Japanese Journal of Applied Physics, Aug. 10, 2004, p. 5239-p. 5242.

"High performance thin-film flip-chip InGaN—GaN light-emitting diodes", O. B. Shchekin et al., Applied Physics Letters, Aug. 16, 2006, p. 071109.

"Fabrication of Thin-GaN LED Structures by Au—Si Wafer bonding", S. C. Hsu and C. Y. Liu, Electrochem. Solid-state Lett, 2006, p. 171-p. 173.

"High-Power and High-Efficiency InGaN-Based Light Emitters", Ansgar Laubsch, IEEE Transactions on Electron Devices, Jan. 2010, p. 79-p. 87.

"Wafer bonding technology for optoelectronic integrated devices", Hiroshi Wada et al., Solid-State Electronics, Aug. 1999, p. 1655-p. 1663.

"Office Action of Taiwan Counterpart Application", issued on Mar. 6, 2015, p. 1-p. 6, in which the listed references were cited.

* cited by examiner

LIGHT EMITTING DIODE

CROSS-REFERENCE TO RELATED APPLICATION

This application claims the priority benefit of Taiwan application serial no. 102104245, filed on Feb. 4, 2013. The entirety of the above-mentioned patent application is hereby incorporated by reference herein and made a part of this specification.

TECHNICAL FIELD

The technical field relates to a light emitting diode.

BACKGROUND

A light emitting diode (LED) is a semiconductor device constituted mainly by group III-V compound semiconductor materials. Since such semiconductor materials have a characteristic of converting electricity into light, when a current is applied to the semiconductor materials, electrons and holes therein would be combined and release excessive energy in a form of light, thereby achieving an effect of luminosity.

A vertical LED apparatus is a common LED apparatus. In a vertical LED apparatus, an LED chip consists of a silicon substrate and a light emitting layer disposed on the silicon substrate. The silicon substrate is disposed on a carrier board, and the LED chip is electrically connected to the carrier board through a bonding wire. Compared to a conventional face-up LED apparatus, the vertical LED apparatus has advantages such as good heat dissipation and lower occurrence of current crowding.

Nonetheless, due to a difference in expansion coefficient between the bonding wire and a sealant in the vertical LED apparatus, breakage easily occurs to result in a failure of the apparatus. In addition, uneven distribution of phosphor in the sealant occurs as a consequence of natural deposition of the phosphor itself and excessively large thickness of the bonding wire and the LED chip. Moreover, since the LED chip is electrically connected to the carrier board through the bonding wire, density of the LED chips in the vertical LED apparatus cannot be further decreased. For a projection type light source that requires multiple chips, luminous intensity per unit area cannot be effectively enhanced.

SUMMARY

According to an exemplary embodiment of the disclosure, a light emitting diode (LED) having good device reliability is provided.

According to an exemplary embodiment of the disclosure, an LED includes a semiconductor stacked structure, a first electrode, a second electrode and a third electrode. The semiconductor stacked structure includes a first semiconductor layer, a second semiconductor layer and a light emitting layer. The first semiconductor layer includes a first surface and a second surface opposite to each other, and the first semiconductor layer includes a first region and a second region. The second semiconductor layer is disposed on the second surface and located in the first region. The light emitting layer is disposed between the first semiconductor layer and the second semiconductor layer. The substrate is disposed opposite to the semiconductor stacked structure and toward the second surface, wherein the substrate has a first conductive layer and a second conductive layer thereon. The first electrode is disposed between the second semiconductor layer and the first conductive layer. The second electrode is disposed on the first surface. The third electrode is at least located in the second region and at least a part of the third electrode is disposed between the second region and the second conductive layer, and is electrically connected to the second electrode.

In the LED according to an exemplary embodiment of the disclosure, the second region includes an opening extending from the second surface to the first surface, and a bottom of the opening is a third surface, wherein the third electrode is disposed on the third surface.

In the LED according to an exemplary embodiment of the disclosure, the second region is located on an edge of the second surface.

In the LED according to an exemplary embodiment of the disclosure, the second region is completely surrounded by the first region.

In the LED according to an exemplary embodiment of the disclosure, the first semiconductor layer is, e.g., an n-type semiconductor layer, and the second semiconductor layer is, e.g., a p-type semiconductor layer.

In the LED according to an exemplary embodiment of the disclosure, a fourth electrode is further included. The fourth electrode is disposed in the first semiconductor layer and connected to the second electrode and the third electrode.

In the LED according to an exemplary embodiment of the disclosure, a protection layer is further included. The protection layer is disposed between the second semiconductor layer and the third electrode.

In the LED according to an exemplary embodiment of the disclosure, a fourth electrode is further included. The fourth electrode is disposed on a sidewall of the first semiconductor layer and connected to the second electrode and the third electrode.

In the LED according to an exemplary embodiment of the disclosure, a protection layer is further included. The protection layer is disposed between the first semiconductor layer and the fourth electrode.

In the LED according to an exemplary embodiment of the disclosure, an area of the second region is, e.g., smaller than or equal to 13% of a total area of the first region and the second region.

In the LED according to an exemplary embodiment of the disclosure, a contact area between the first electrode and the first conductive layer is, e.g., larger than or equal to 30% of an area of the second surface.

In the LED according to an exemplary embodiment of the disclosure, a protection layer is further included. The protection layer is disposed on a sidewall of the opening and on the second semiconductor layer around the opening.

In the LED according to an exemplary embodiment of the disclosure, an undoped semiconductor layer is further included. The undoped semiconductor layer is disposed on an edge of the first surface and surrounds the first surface. The second electrode is disposed on the undoped semiconductor layer and the first surface.

In the LED according to an exemplary embodiment of the disclosure, at least one island structure is further included. The island structure is disposed in the second region. A top surface of the island structure is coplanar with a top surface of the second semiconductor layer, and the third electrode is disposed between the island structure and the second region, wherein the island structure consists of the first semiconductor layer, the light emitting layer and the second semiconductor layer.

In the LED according to an exemplary embodiment of the disclosure, the first electrode includes a mirror layer, a barrier layer and a bonding layer. The mirror layer is disposed on the second semiconductor layer. The barrier layer covers the mirror layer. The bonding layer is disposed on the barrier layer.

In the LED according to an exemplary embodiment of the disclosure, a protection layer is further included. The protection layer is disposed on the sidewall of the opening, the second semiconductor layer around the opening and the barrier layer, and a portion of the third electrode is located on the protection layer.

In the LED according to an exemplary embodiment of the disclosure, the sidewall of the first semiconductor layer is, e.g., an inclined plane.

In the LED according to an exemplary embodiment of the disclosure, a ring-shaped electrode is further included, wherein the second region surrounds the light emitting layer, and the ring-shaped electrode is disposed in the second region.

In the LED according to an exemplary embodiment of the disclosure, the second electrode includes a plurality of first sub-electrodes, the third electrode includes a plurality of second sub-electrodes, and each of the second sub-electrodes is connected between the first sub-electrode corresponding thereto and the second conductive layer.

In the LED according to an exemplary embodiment of the disclosure, the semiconductor stacked structure has a thickness of less than 20 μm.

Based on the above, according to the disclosure, the semiconductor stacked structure is bonded to the conductive layer on the substrate by flip-chip bonding. Thus, problems such as uneven distribution of phosphor in a sealant and failure of the LED due to breakage of a bonding wire are unlikely to occur. Accordingly, the LED according to the disclosure has good device reliability. In addition, in the LED according to the disclosure, the second surface of the n-type first semiconductor layer has an opening for disposing the third electrode, and there is a gap between the third electrode and the light emitting layer. Therefore, there is no need to dispose an additional insulating layer between the third electrode and the light emitting layer for electrically isolating the third electrode and the light emitting layer from each other.

Several exemplary embodiments accompanied with figures are described in detail below to further describe the disclosure in details.

DETAILED DESCRIPTION OF DISCLOSED EMBODIMENTS

Figure 1A:
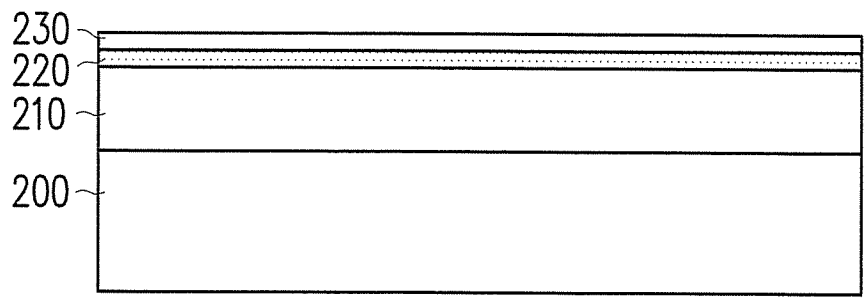
FIG. 1A to FIG. 1E are schematic cross-sectional views of a fabrication process of a light emitting diode (LED) according to the first exemplary embodiment.

FIG. 1A to FIG. 1E are schematic cross-sectional views of a fabrication process of a light emitting diode (LED) according to the first exemplary embodiment. Referring to FIG. 1A first, on a carrier substrate 200, a first semiconductor material layer 210, a light emitting material layer 220 and a second semiconductor material layer 230 are formed in sequence. Before the growth of the first semiconductor material layer 210, an undoped semiconductor layer is grown to reduce epitaxial defects in number. The carrier substrate 200 is, e.g., a sapphire substrate or a silicon substrate. In the present exemplary embodiment, the first semiconductor material layer 210, the light emitting material layer 220 and the second semiconductor material layer 230 are formed by an epitaxy process. Of course, the disclosure is not limited hereto. The above-mentioned material layers may be formed by other suitable processes. The methods of formation are well known by persons of ordinary skill in the art, and thus details thereof are not described herein.

Figure 1B:
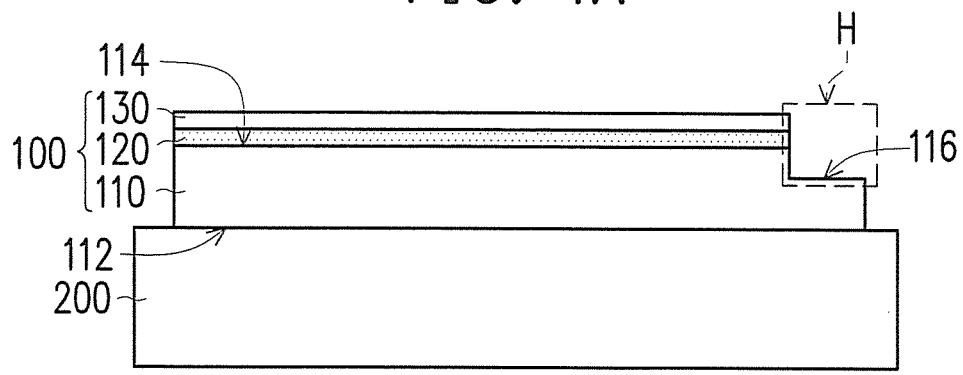

Next, referring to FIG. 1B, portions of the first semiconductor material layer 210, the light emitting material layer 220 and the second semiconductor material layer 230 are removed to form a first semiconductor layer 110, a light emitting layer 120 and a second semiconductor layer 130. The first semiconductor layer 110, the light emitting layer 120 and the second semiconductor layer 130 constitute a semiconductor stacked structure 100. In the present exemplary embodiment, the semiconductor stacked structure 100 has a thickness of less than 20 μm. The first semiconductor layer 110 is, e.g., an n-type semiconductor layer, while the second semiconductor layer 130 is, e.g., a p-type semiconductor layer. Of course, the disclosure is not limited hereto. In other exemplary embodiments, the first semiconductor layer 110 is, e.g., a p-type semiconductor layer, while the second semiconductor layer 130 is, e.g., an n-type semiconductor layer.

Figure 19A:
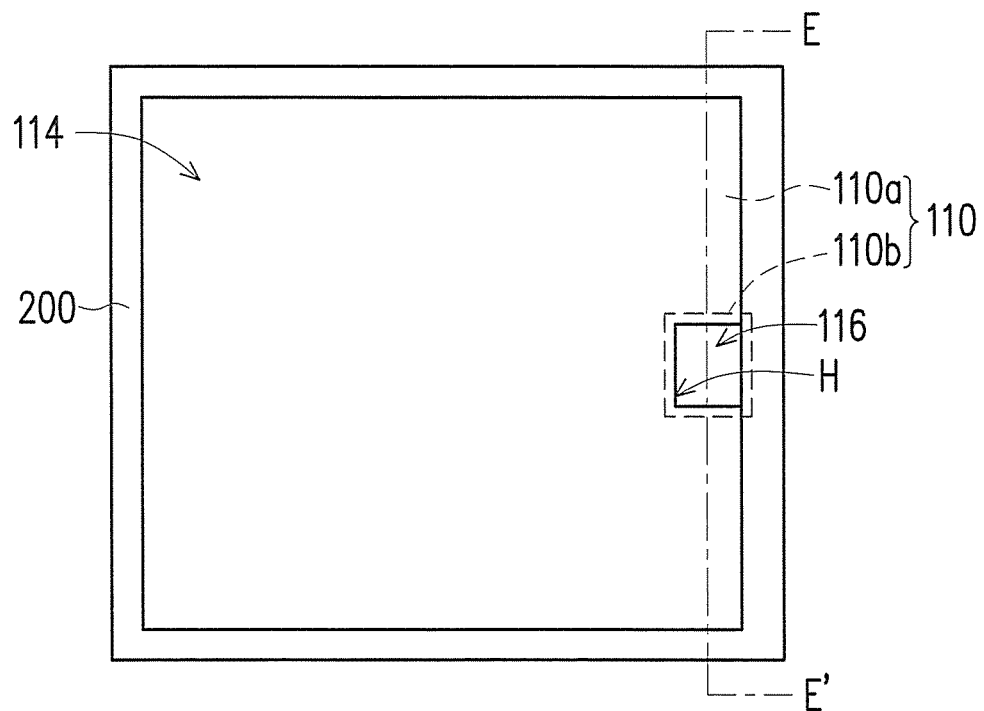
FIG. 19A is a schematic top view of FIG. 1B.
Figure 19B:
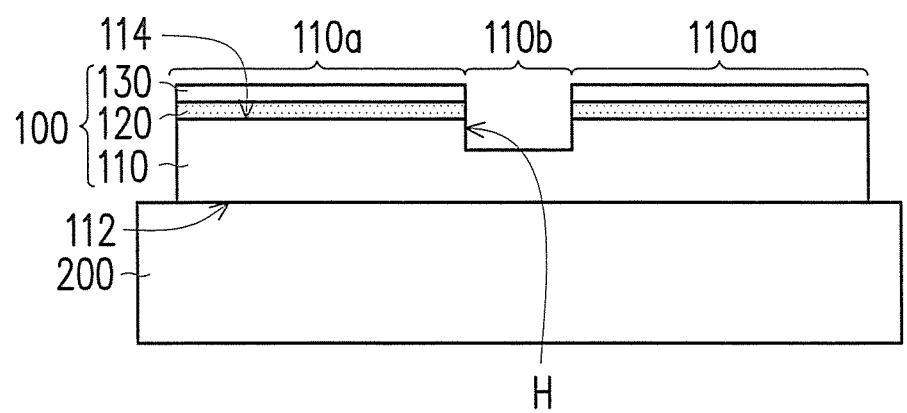
FIG. 19B is a schematic cross-sectional view along line E-E' in FIG. 19A.

FIG. 19A is a schematic top view of FIG. 1B, wherein FIG. 19 does not illustrate the second semiconductor layer 130 and the light emitting layer 120, so as to clearly show a profile of the first semiconductor layer 110. FIG. 19B is a schematic cross-sectional view along line E-E' in FIG. 19A. Referring to FIG. 1B, FIG. 19A and FIG. 19B together, the first semiconductor layer 110 includes a first surface 112 and a second surface 114 opposite to each other. The first semiconductor layer 110 includes a first region 110a and a second region 110b. The second semiconductor layer 130 is disposed on the first region 110a. The second region 110b includes an opening H extending from the second surface 114 to the first surface 112. A bottom of the opening H is a third surface 116. The bottom of the opening H is located in the first semiconductor layer 110. Since the opening H is formed by removing the portions of the first semiconductor material layer 210, the light emitting material layer 220 and the second semiconductor material layer 230, a size of the opening H affects an area of the light emitting layer 120.

In the present exemplary embodiment, the second region 110b is located on an edge of the second surface 114. Of course, the disclosure is not limited hereto. In other exemplary embodiment, the second region 110b may not be located on the edge of the second surface 114. In other words, the second region 110b (not illustrated) may also be completely surrounded by the first region 110a, and the second region 110b is located at an arbitrary position. It is worth mentioning that it is favorable in terms of process simplification if the second region 110b is located on the edge of the second surface 114. An area of the third surface 116 is smaller than or equal to 13% of a total area of the second surface 114 and the third surface 116. Further, an area of the second region is smaller than or equal to 13% of a total area of the first region and the second region. In other exemplary embodiment, the area of the third surface 116 is smaller than or equal to 10% of the total area of the second surface 114 and the third surface 116. More preferably, the area of the third surface 116 is smaller than or equal to 3% of the total area of the second surface 114 and the third surface 116. It is to be noted that the size of the opening H is not limited in the disclosure as long as the area of the third surface 116 is smaller than or equal to 13% of the total area of the second surface 114 and the third surface 116.

Figure 1C:
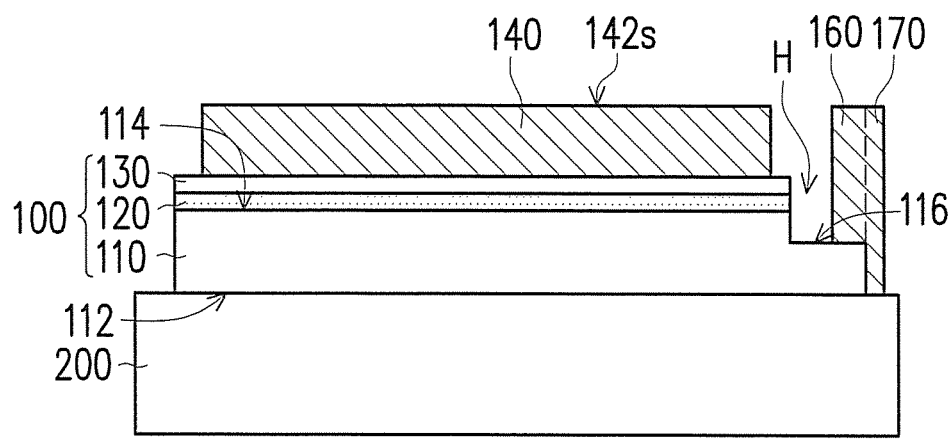

Then, referring to FIG. 1C, a first electrode 140, a third electrode 160 and a fourth electrode 170 are formed on the carrier substrate 200, wherein the aforementioned electrodes are formed by, e.g., electroplating. The first electrode 140 is located on the second semiconductor layer 130. The third electrode 160 is disposed on the second region 110b. More specifically, the third electrode 160 is located in the opening H and on the third surface 116. The fourth electrode 170 is located on a sidewall 118 of the first semiconductor layer 110 and connected to the third electrode 160.

Figure 1D:
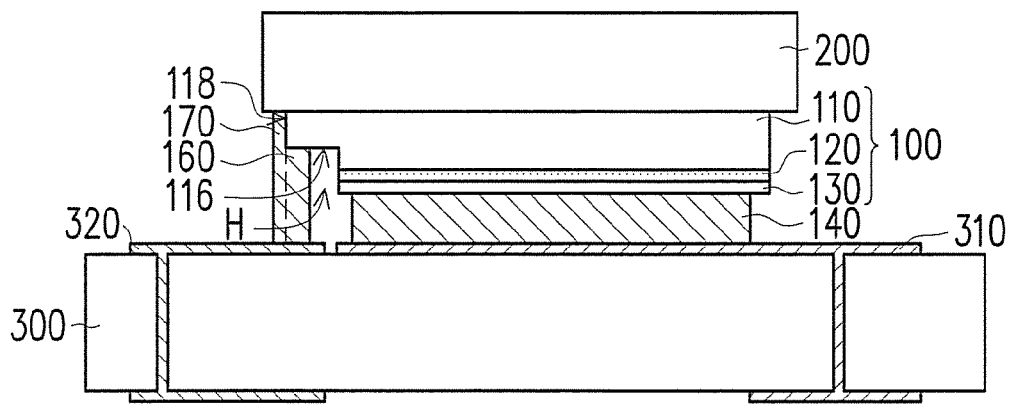

Next, referring to FIG. 1D, the structure shown in FIG. 1C is bonded to a substrate 300. The substrate 300 is, e.g., a printed circuit board. In the present exemplary embodiment, the substrate 300 has a first conductive layer 310 and a second conductive layer 320 on its surface. The first electrode 140 and the third electrode 160 are connected to the first conductive layer 310 and the second conductive layer 320 respectively. Specifically, in the present exemplary embodiment, the first electrode 140 is located between the second semiconductor layer 130 and the first conductive layer 310, the third electrode 160 is located between the first semiconductor layer 110 and the second conductive layer 320, and the fourth electrode 170 is located on the sidewall 118 of the first semiconductor layer 110 and a sidewall of the third electrode 160. In the present exemplary embodiment, the semiconductor stacked structure 100 is bonded onto the substrate 300 by flip-chip bonding. Accordingly, the semiconductor stacked structure 100 may be electrically connected to a conductive layer (such as the first conductive layer 310 and the second conductive layer 320) on the substrate 300 without using a bonding wire. In this way, the chance of uneven distribution of phosphor in a sealant occurring in follow-on processes is reduced.

Figure 20:
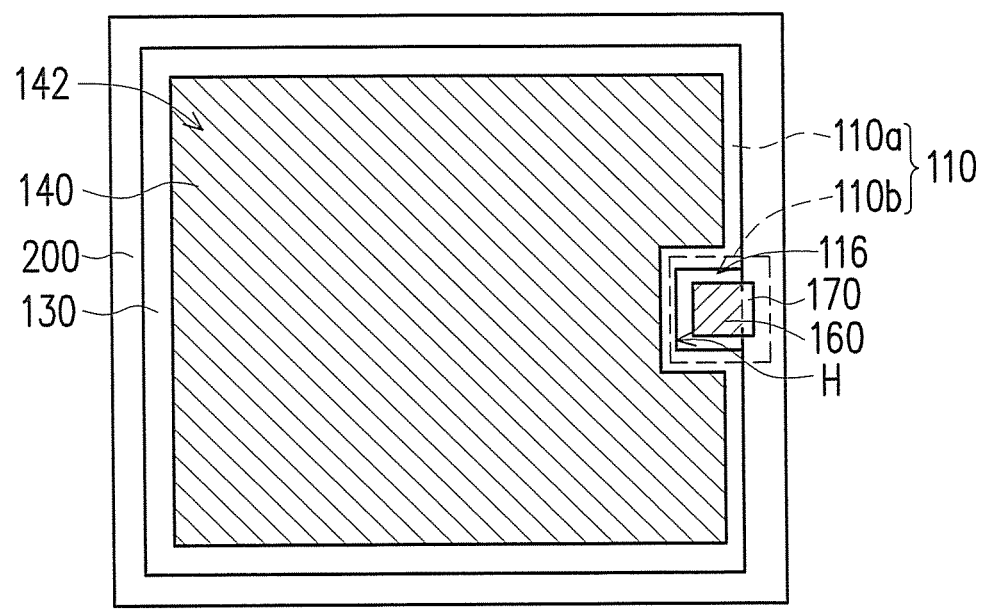
FIG. 20 is a schematic top view of FIG. 1C.

FIG. 20 is a schematic top view of FIG. 1C. Referring to FIG. 1C, FIG. 1D and FIG. 20 together, in FIG. 1D, the first electrode 140 is configured to be electrically connected to the first conductive layer 310, wherein the first electrode 140 is connected to the first conductive layer 310 by its surface 140s. A contact area (i.e. the area of the surface 140s) between the first electrode 140 and the first conductive layer 310 is larger than or equal to 30% of an area of the second surface 114, thus enhancing heat dissipation. Preferably, the contact area between the first electrode 140 and the first conductive layer 310 is larger than or equal to 50% of the area of the second surface 114, so as to further enhance heat dissipation.

In addition, in the case where an LED includes a plurality of semiconductor stacked structures 100, since no bonding wire is required for electric connection between the semiconductor stacked structures 100 and the conductive layer of the substrate 300, the density of these semiconductor stacked structures 100 may be increased, and luminous intensity is effectively enhanced.

Figure 1E:
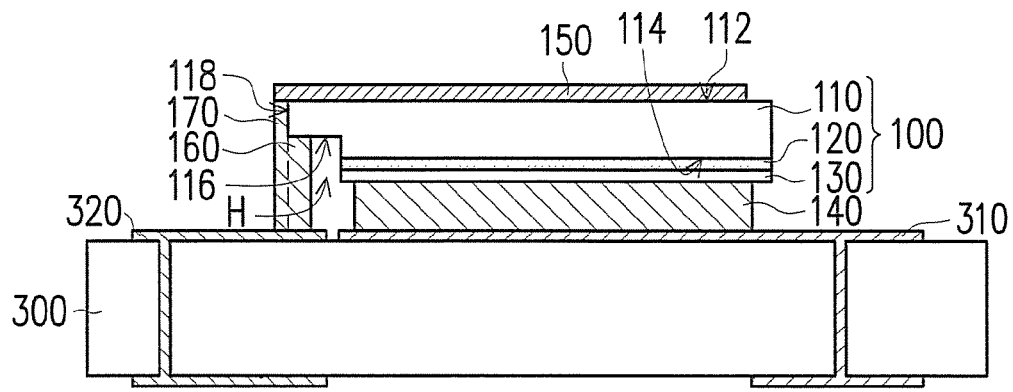

Then, referring to FIG. 1E, the carrier substrate 200 is removed. It is worth mentioning that when the carrier substrate 200 is being detached from the first semiconductor layer 110, since the fourth electrode 170 is connected to the third electrode 160, and the third electrode 160 is located on the third surface 116, the fourth electrode 170 is unlikely to fall off with the detachment of the carrier substrate 200. Next, a second electrode 150 is formed on the first surface 112 of the first semiconductor layer 110, thereby fabricating an LED 100a, wherein the second electrode 150 is connected to the fourth electrode 170. A material of the second electrode 150 is, e.g., metal or a transparent conductive film.

In addition, with respect to a process of removing the carrier substrate 200 utilizing laser lift-off (LLO) technology (e.g. growth of GaN on a sapphire substrate), an interlayer (e.g. Al) having a melting point of less than 1000° C. (the highest instantaneous temperature of the LLO process), or an interlayer (e.g. ITO) having a material band gap of less than laser photon energy (KrF: 4.9 eV) is interposed between the fourth electrode 170 and the carrier substrate 200, so as to reduce damage caused to the fourth electrode 170 during the LLO process due to an impact of laser.

In the present exemplary embodiment, the first semiconductor layer 110 retracts from the edge of the second surface 114 to form a containing space (i.e. the opening H). This containing space is configured for disposing the third electrode 160, and the third electrode 160 is electrically connected to the second electrode 150 on the first surface 112 through the fourth electrode 170. The third electrode 160 is in place of a metal bonding wire of a conventional vertical LED, transmitting a current of the second electrode 150 to the second conductive layer 320 on the substrate 300 to form a wire-less vertical LED structure. Since the third electrode 160 and the light emitting layer 120 have a gap therebetween, an electric isolation effect is achieved without a need to dispose an additional insulating layer between the third electrode 160 and the light emitting layer 120. Based on the above, the LED 100a according to the present exemplary embodiment has good device reliability.

Several exemplary embodiments will be given hereinafter to describe the disclosure in detail, wherein the same components are denoted by the same reference numerals and descriptions of the same technical content will be omitted. The omitted content may be understood with reference to the aforementioned embodiments, and will not be repeated hereinafter.

Figure 2:
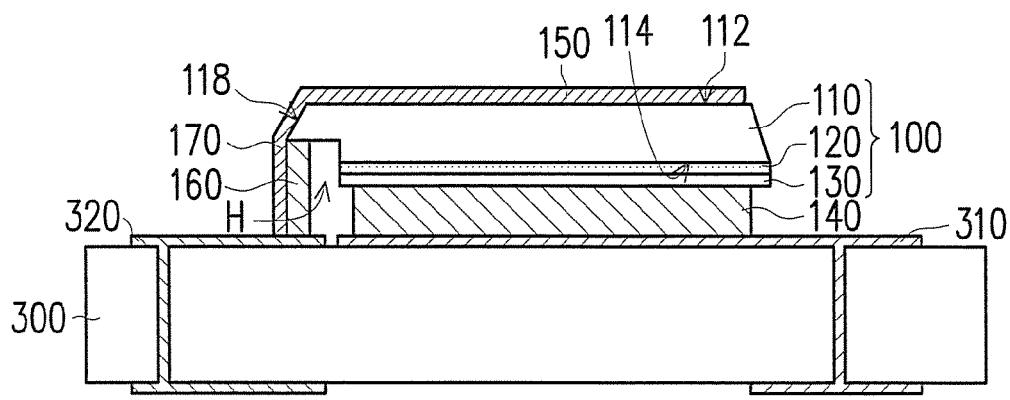
FIG. 2 is a schematic cross-sectional view of an LED according to the second exemplary embodiment.

FIG. 2 is a schematic cross-sectional view of an LED according to the second exemplary embodiment. Referring to FIG. 2, an LED 100b of the second exemplary embodiment has a structure similar to that of the LED 100a of the first exemplary embodiment. A difference between them lies in that in the LED 100b, the sidewall 118 of the first semiconductor layer 110 is an inclined plane. In the present exemplary embodiment, since the sidewall 118 of the first semiconductor layer 110 is an inclined plane, it is easier for the fourth electrode 170 to be formed on the sidewall 118.

Figure 3:
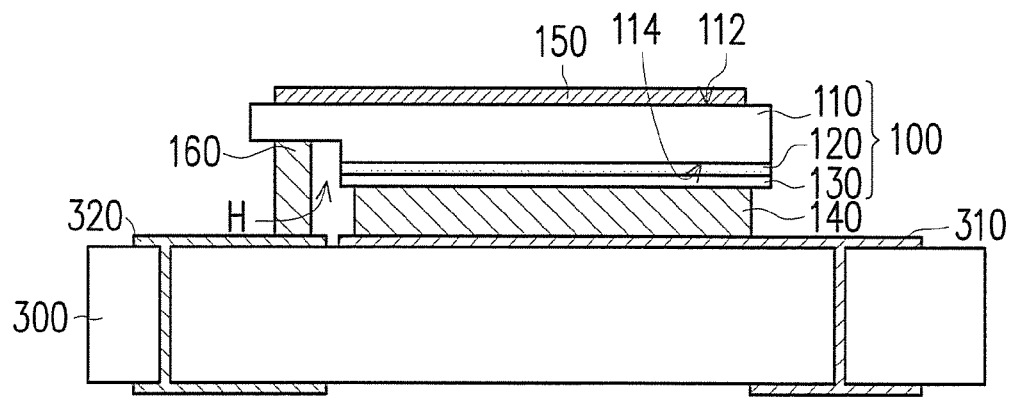
FIG. 3 is a schematic cross-sectional view of an LED according to the third exemplary embodiment.

FIG. 3 is a schematic cross-sectional view of an LED according to the third exemplary embodiment. Referring to FIG. 3, an LED 100c of the third exemplary embodiment has a structure similar to that of the LED 100a of the first exemplary embodiment. A difference between them lies in that the LED 100c does not include the fourth electrode 170 as shown in FIG. 1. Specifically, the second electrode 150 and the third electrode 160 are respectively located on two opposite sides of the first semiconductor layer 110 and partially overlap each other. A voltage may be applied to the third electrode 160 to electrically conduct the second electrode 150 with the third electrode 160. In addition, an ohmic contact layer (not illustrated) is selectively formed between the second electrode 150 and the first semiconductor layer 110 and between the third electrode 160 and the first semiconductor layer 110, so as to reduce contact impedance between the second electrode 150 and the first semiconductor layer 110 and between the third electrode 160 and the first semiconductor layer 110. In this way, the second electrode 150 may be electrically connected with the third electrode 160, thereby bringing the LED 100c into operation.

Figure 4:
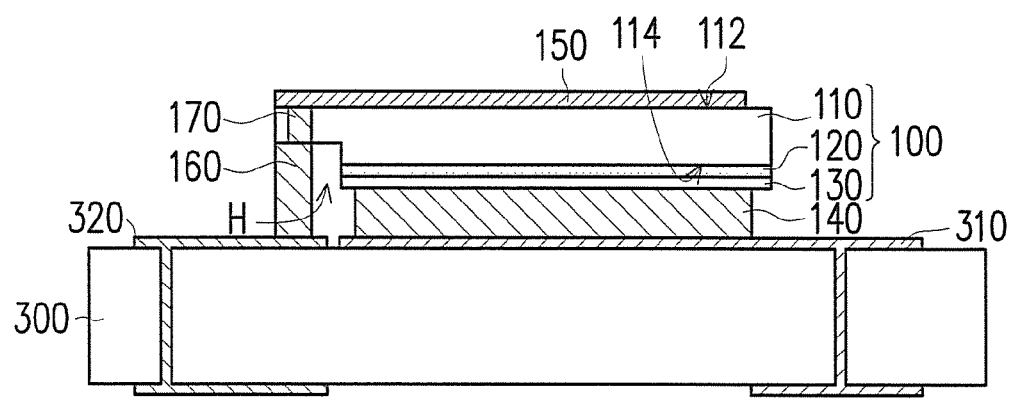
FIG. 4 is a schematic cross-sectional view of an LED according to the fourth exemplary embodiment.

FIG. 4 is a schematic cross-sectional view of an LED according to the fourth exemplary embodiment. Referring to FIG. 4, an LED 100d of the fourth exemplary embodiment has a structure similar to that of the LED 100a of the first exemplary embodiment. A difference between them lies in that in the LED 100d, the fourth electrode 170 is located in the first semiconductor layer 110 and connected to the second electrode 150 and the third electrode 160.

Figure 5A:
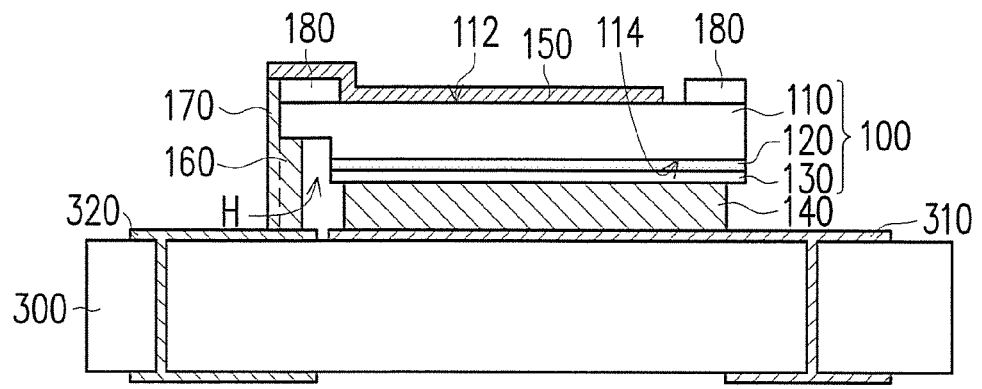
FIG. 5A is a schematic cross-sectional view of an LED according to the fifth exemplary embodiment.
Figure 5B:
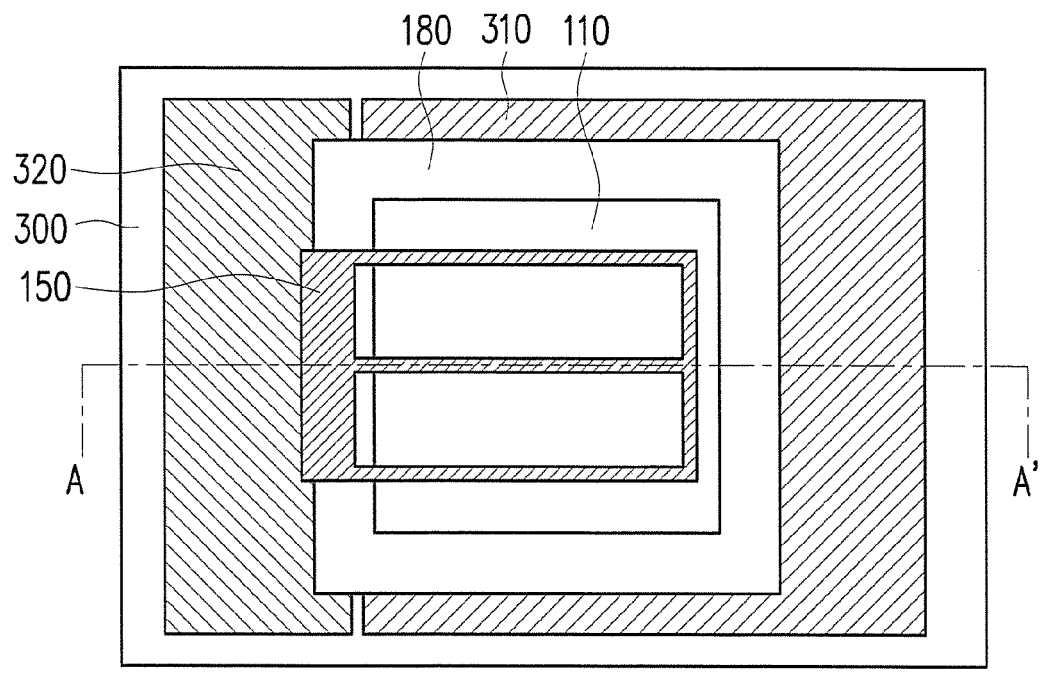
FIG. 5B is a schematic top view of the LED in FIG. 5A.

FIG. 5A is a schematic cross-sectional view of an LED according to the fifth exemplary embodiment. FIG. 5B is a schematic top view of the LED in FIG. 5A, wherein FIG. 5A is a schematic cross-sectional view along a section line A-A' in FIG. 5B. Referring to FIG. 5A and FIG. 5B together, an LED 100e of the fifth exemplary embodiment has a structure similar to that of the LED 100a of the first exemplary embodiment. A difference between them lies in that the LED 100e further includes an undoped semiconductor layer 180. The undoped semiconductor layer 180 is located on an edge of the first surface 112 and surrounds the first surface 112, as shown in FIG. 5B. In the present exemplary embodiment, the second electrode 150 is disposed on the undoped semiconductor layer 180 and the first surface 112 of the first semiconductor layer 110.

Referring to FIG. 5A and FIG. 1A together, in the present exemplary embodiment, before the formation of the first semiconductor material layer 210, the undoped semiconductor layer 180 is first formed on the carrier substrate 200, and then the first semiconductor material layer 210, the light emitting material layer 220 and the second semiconductor material layer 230 are formed in sequence. The undoped semiconductor layer 180 serves as a buffer layer to reduce the difference in characteristics between the carrier substrate 200 and the first semiconductor material layer 210, which is favorable for the formation of the first semiconductor material layer 210 on the carrier substrate 200. Then, the steps as shown in FIG. 1B and FIG. 1C are performed. Next, referring to FIG. 5A and FIG. 1D together, the carrier substrate 200 is removed to expose the undoped semiconductor layer 180. Next, referring to FIG. 5A and FIG. 1E together, a patterning process is performed to remove a portion of the undoped semiconductor layer 180, wherein the portion of the undoped semiconductor layer 180 on the edge of the first surface 112 is retained, thus preventing the fourth electrode 170 from damage during the partial removal of the undoped semiconductor layer 180. After that, the second electrode 150 is formed, so as to form a pattern as shown in FIG. 5B. A material of the undoped semiconductor layer 180 is a semiconductor material layer that is not doped, including, e.g., gallium nitride or other suitable semiconductor materials.

Figure 6:
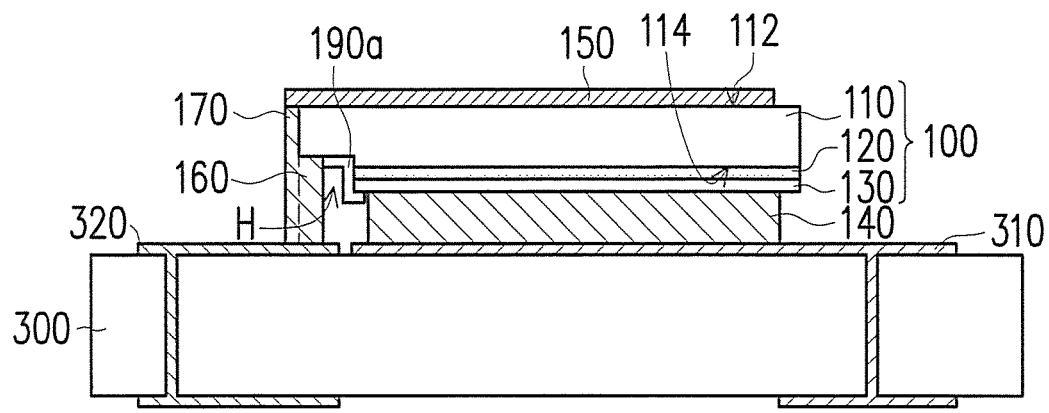
FIG. 6 is a schematic cross-sectional view of an LED according to the sixth exemplary embodiment.

FIG. 6 is a schematic cross-sectional view of an LED according to the sixth exemplary embodiment. Referring to FIG. 6, an LED 100f of the sixth exemplary embodiment has a structure similar to that of the LED 100a of the first exemplary embodiment. A difference between them lies in that the LED 100f further includes a protection layer 190a located at the opening H, wherein the protection layer 190a is located on a sidewall of the opening H and on a portion of the second semiconductor layer 130 around the opening H. A material of the protection layer 190a is, e.g., an insulating material. The protection layer 190a may further reduce the possibility of a contact between the third electrode 160 and the light emitting layer 120. Specifically, when the semiconductor stacked structure 100 is bonded onto the substrate 300, the third electrode 160 may be squeezed to deform during the bonding, resulting in the contact between the third electrode 160 and the light emitting layer 120. The arrangement of the protection layer 190a may avoid occurrence of the above-mentioned contact.

Figure 7:
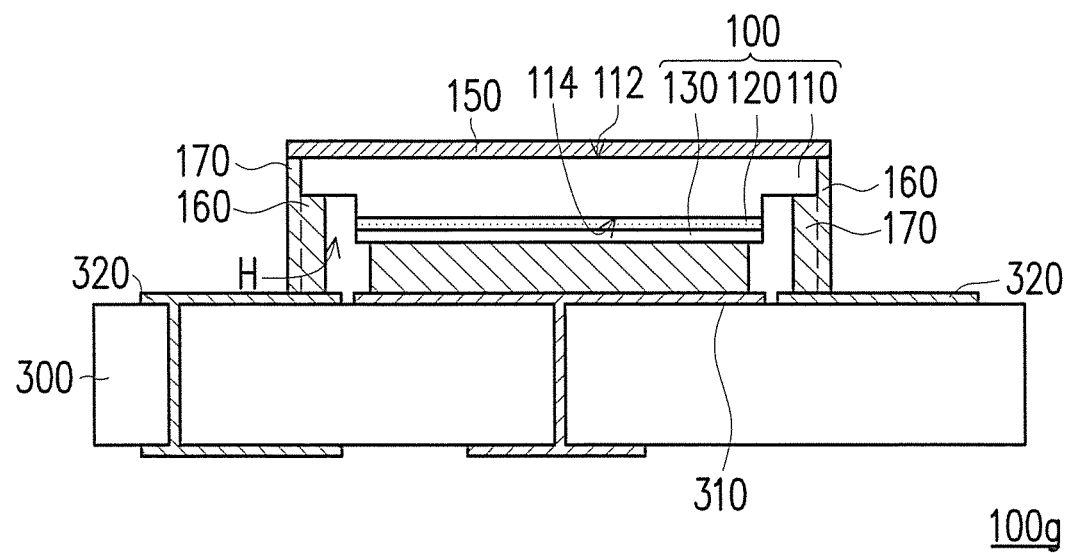
FIG. 7 is a schematic cross-sectional view of an LED according to the seventh exemplary embodiment.

FIG. 7 is a schematic cross-sectional view of an LED according to the seventh exemplary embodiment. Referring to FIG. 7, an LED 100g of the seventh exemplary embodiment has a structure similar to that of the LED 100a of the first exemplary embodiment. A difference between them lies in that while the LED 100a has the third electrode 160 and the fourth electrode 170 disposed on only one side of the semiconductor stacked structure 100, the LED 100g has third electrodes 160 as well as fourth electrodes 170 disposed respectively on two opposite sides of the semiconductor stacked structure 100.

Figure 8:
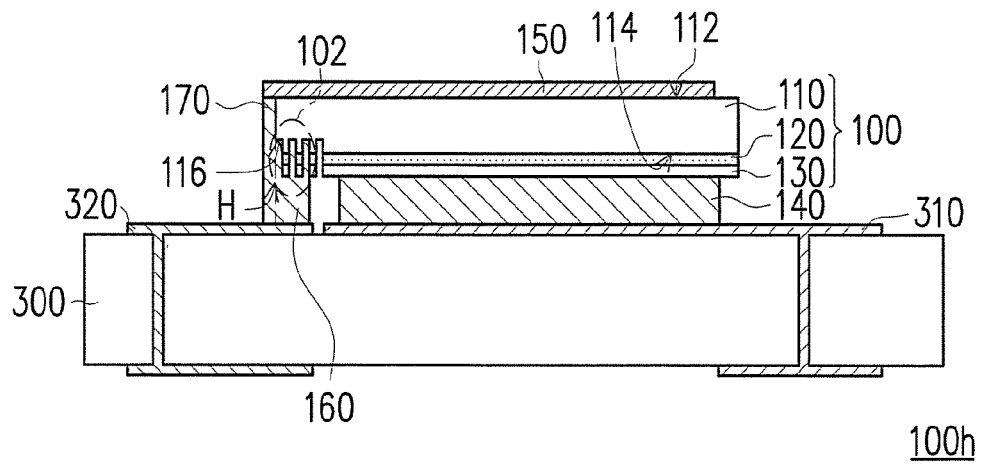
FIG. 8 is a schematic cross-sectional view of an LED according to the eighth exemplary embodiment.

FIG. 8 is a schematic cross-sectional view of an LED according to the eighth exemplary embodiment. Referring to FIG. 8, an LED 100h of the eighth exemplary embodiment has a structure similar to that of the LED 100a of the first exemplary embodiment. A difference between them lies in that the LED 100h further includes at least one island structure 102. The island structure 102 is located on the third surface 116, and the island structure 102 consists of, e.g., the first semiconductor layer 110, the light emitting layer 120 and the second semiconductor layer 130. The present exemplary embodiment provides an example where the LED 100h includes two island structures 102. However, the disclosure is not limited hereto. In other exemplary embodiments, only one or two island structures 102 may be disposed, or three or more island structures 102 may be disposed.

Referring to FIG. 8 and FIG. 1B together, the island structures 102 are formed in a manner of, e.g., being formed concurrently with the opening H. The island structures 102 are located in the opening H, and the island structures 102 have top surfaces coplanar with a top surface of the second semiconductor layer 130. Next, referring to FIG. 8 and FIG. 1C together, during the fabrication of the third electrode 160, the third electrode 160 is filled between the adjacent island structures 102. It is worth mentioning that, since the opening H of the present exemplary embodiment has the island structures 102 therein, it is easier for a top surface of the formed third electrode 160 to be coplanar with a top surface of the first electrode 140. In this way, in a follow-on flip-chip bonding process, it is ensured that the third electrode 160 and the first electrode 140 are smoothly bonded to the conductive layer on the substrate 300, and the chance of failure is reduced.

Figure 9:
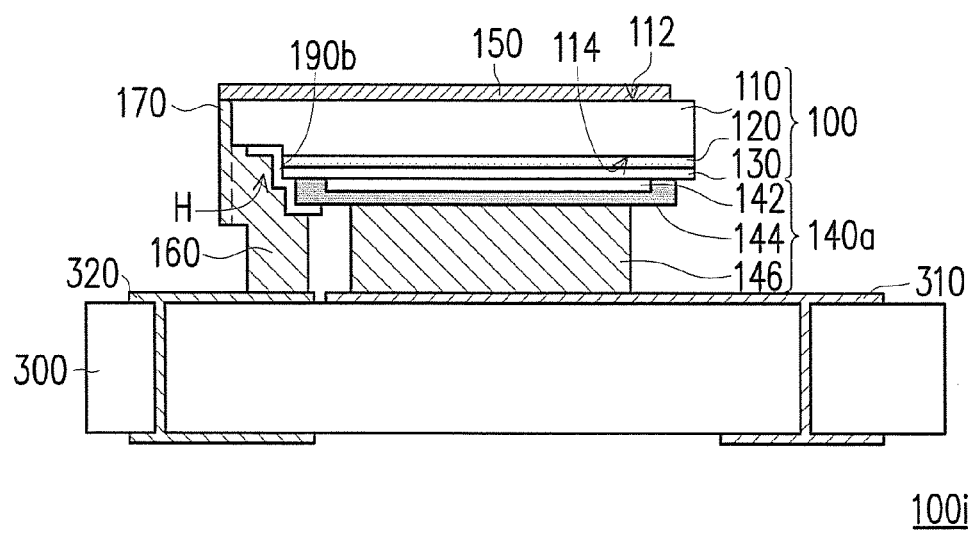
FIG. 9 is a schematic cross-sectional view of an LED according to the ninth exemplary embodiment.

FIG. 9 is a schematic cross-sectional view of an LED according to the ninth exemplary embodiment. Referring to FIG. 9, an LED 100i of the ninth exemplary embodiment has a structure similar to that of the LED 100a of the first exemplary embodiment. A difference between them lies in that the LED 100i further includes a protection layer 190b located at the opening H, and that a first electrode 140a includes a mirror layer 142, a barrier layer 144 and a bonding layer 146.

The mirror layer 142 is located on the second semiconductor layer 130, the barrier layer 144 covers the mirror layer 142, and the bonding layer 146 is located on the barrier layer 144, wherein the mirror layer 142, the barrier layer 144 and the bonding layer 146 are all conductive materials. The mirror layer 142 is, e.g., a conductive material having high reflectivity, such as silver. When light emitted from the light emitting layer 120 is transmitted to the mirror layer 142, the mirror layer 142 reflects the light to cause the light to exit from the first surface 112 of the first semiconductor layer 110. In this way, luminous efficacy of the LED 100i is enhanced. The barrier layer 144 mainly serves to reduce atomic aggregation or migration from occurring in the mirror layer 142 under high temperatures, so as to reduce the chance that the mirror layer 142 decreases in reflectivity, and to further extend the time during which the mirror layer 142 maintains high reflectivity. The bonding layer 146 is configured to be connected to the first conductive layer 310.

In the present exemplary embodiment, the protection layer 190b is, e.g., filled into the opening H before the formation of the third electrode 160. Moreover, the protection layer 190b further covers the sidewall of the opening H, the second semiconductor layer 130 around the opening H and a portion of the barrier layer 144. Next, the third electrode 160 is formed. Thus, a portion of the third electrode 160 is located on the protection layer 190b. A material of the protection layer 190b is, e.g., an insulating material. The protection layer 190b further reduces the possibility of the contact between the third electrode 160 and the light emitting layer 120. Specifically, when the semiconductor stacked structure 100 is bonded onto the substrate 300, the third electrode 160 may be squeezed to deform during the bonding, resulting in the contact between the third electrode 160 and the light emitting layer 120. The arrangement of the protection layer 190b may avoid the occurrence of the above-mentioned contact.

Figure 10:
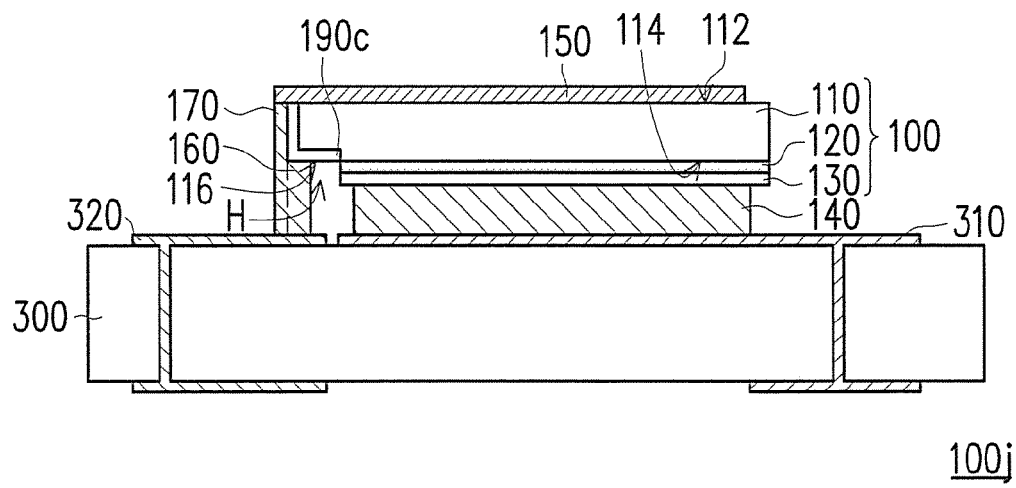
FIG. 10 is a schematic cross-sectional view of an LED according to the tenth exemplary embodiment.

FIG. 10 is a schematic cross-sectional view of an LED according to the tenth exemplary embodiment. Referring to FIG. 10, an LED 100j of the tenth exemplary embodiment has a structure similar to that of the LED 100a of the first exemplary embodiment. A difference between them lies in that the LED 100j further includes a protection layer 190c. The protection layer 190c is disposed between the first semiconductor layer 110 and the fourth electrode 170, extending to cover the third surface 116 of the opening H, so as to prevent the third electrode 160 and the fourth electrode 170 from directly contacting the first semiconductor layer 110. In this way, a direct transmission of a current from the third electrode 160 and the fourth electrode 170 into the first semiconductor layer 110 is prevented, thereby reducing the chance of current crowding.

Figure 11:
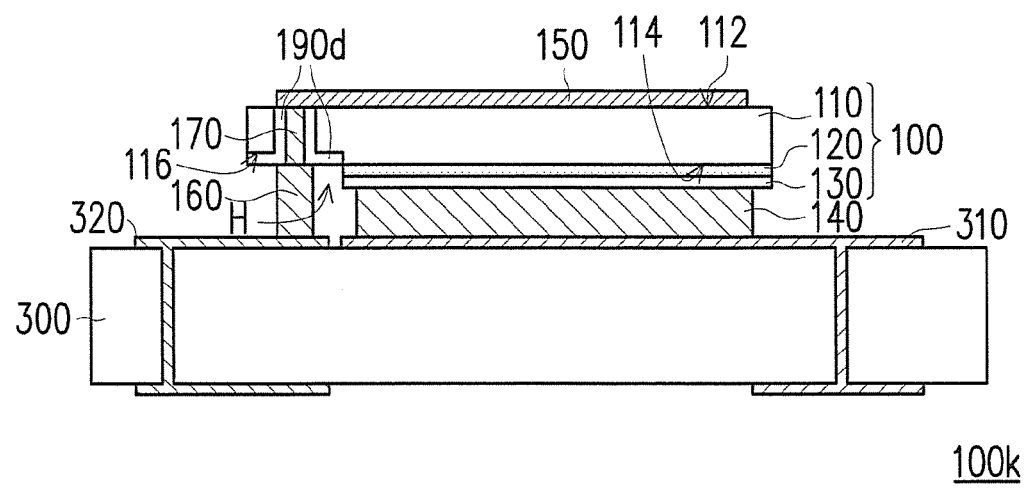
FIG. 11 is a schematic cross-sectional view of an LED according to the eleventh exemplary embodiment.

FIG. 11 is a schematic cross-sectional view of an LED according to the eleventh exemplary embodiment. Referring to FIG. 11, an LED 100k of the eleventh exemplary embodiment has a structure similar to that of the LED 100d of the fourth exemplary embodiment. A difference between them lies in that the LED 100k further includes a protection layer 190d. The protection layer 190d is disposed between the first semiconductor layer 110 and the fourth electrode 170, extending to cover the third surface 116 of the opening H, so as to prevent the third electrode 160 and the fourth electrode 170 from directly contacting the first semiconductor layer 110. In this way, the direct transmission of a current from the third electrode 160 and the fourth electrode 170 into the first semiconductor layer 110 is prevented, thereby reducing the chance of current crowding.

Figure 12A:
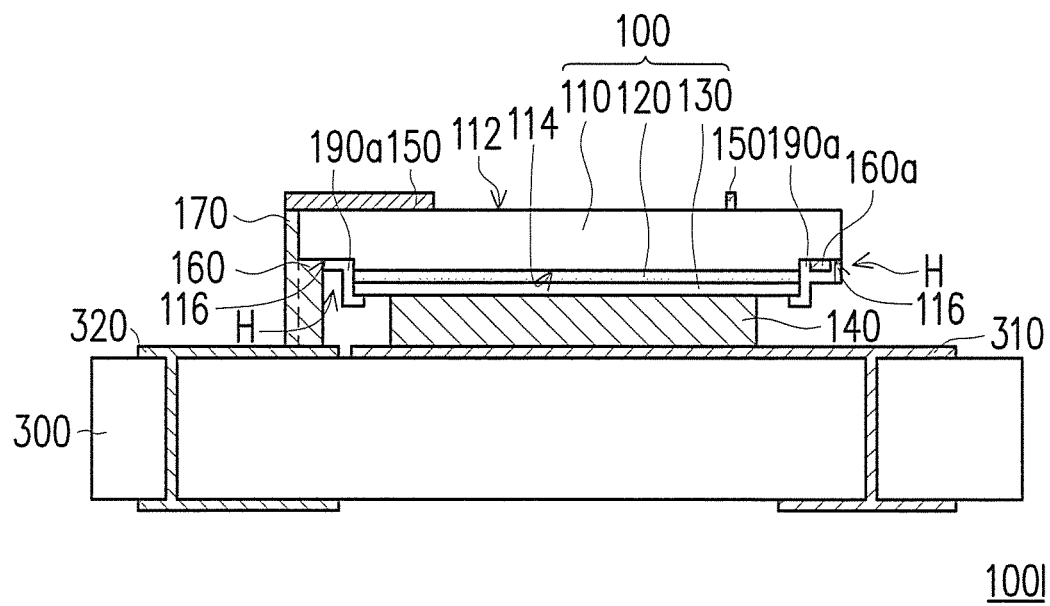
FIG. 12A is a schematic cross-sectional view of an LED according to the twelfth exemplary embodiment.
Figure 12B:
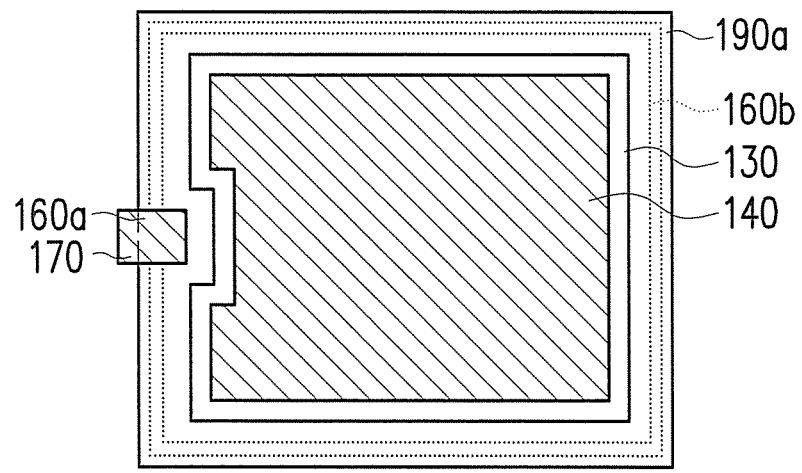
FIG. 12B is a schematic bottom view of FIG. 12A.

FIG. 12A is a schematic cross-sectional view of an LED according to the twelfth exemplary embodiment. FIG. 12B is a schematic bottom view of an LED 100l in FIG. 12A, wherein the substrate 300, the first conductive layer 310 and the second conductive layer 320 are omitted from FIG. 12B. Referring to FIG. 12A and FIG. 12B, the LED 100l of the twelfth exemplary embodiment has a structure similar to that of the LED 100f of the sixth exemplary embodiment. A difference between them lies in that the LED 100l further includes a ring-shaped electrode 160a. Specifically, the opening H of the present exemplary embodiment is located on the edge of the second surface 114, and the opening H surrounds the light emitting layer 120. The ring-shaped electrode 160a is disposed on the third surface 116 of the opening H, and thus the ring-shaped electrode 160a is, e.g., disposed surrounding the light emitting layer 120. The ring-shaped electrode 160a is electrically connected to the third electrode 160, thus further reducing the chance of current crowding.

Figure 13A:
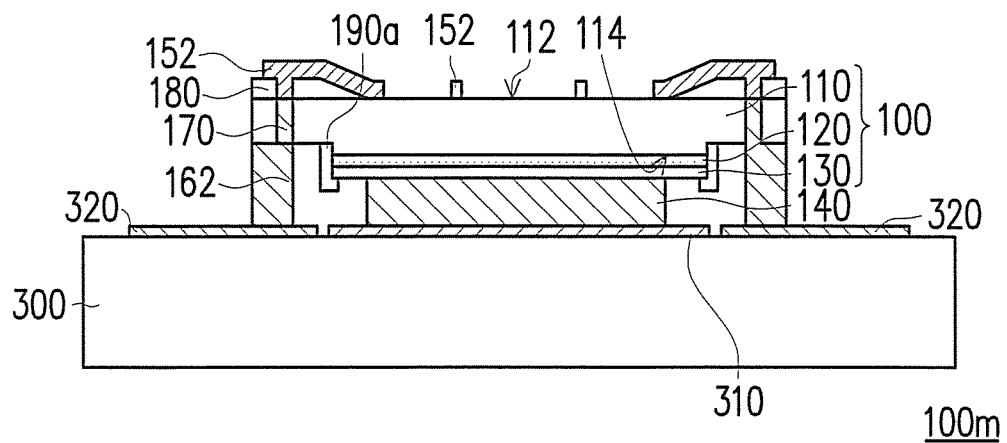
FIG. 13A is a schematic cross-sectional view of an LED according to the thirteenth exemplary embodiment.
Figure 13B:
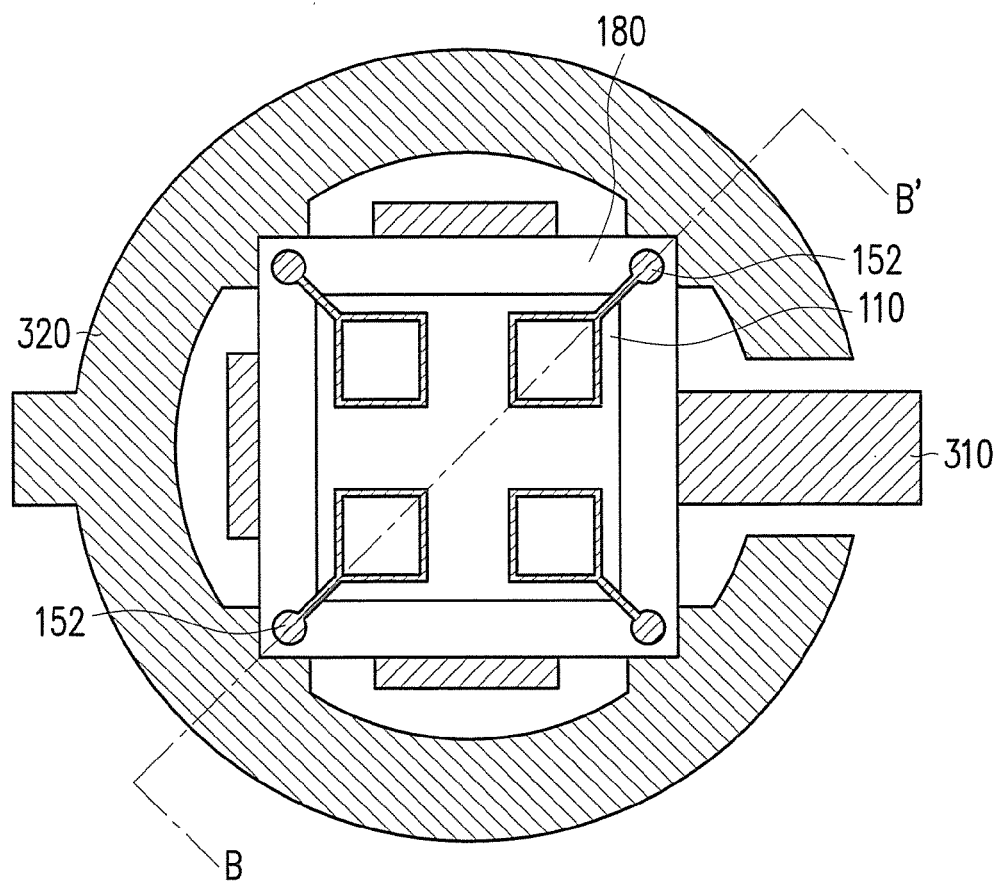
FIG. 13B is a schematic top view of FIG. 13A.
Figure 13C:
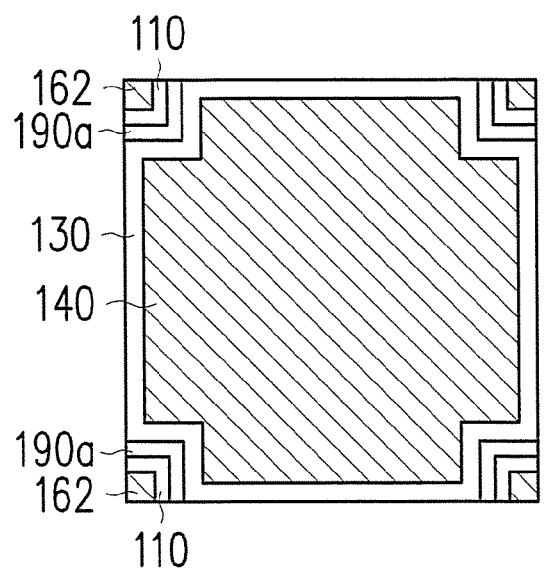
FIG. 13C is a schematic bottom view of FIG. 13A.

FIG. 13A is a schematic cross-sectional view of an LED according to the thirteenth exemplary embodiment. FIG. 13B is a schematic top view of an LED 100m in FIG. 13A, wherein the substrate 300 is omitted from FIG. 13B, and FIG. 13A is a schematic cross-sectional view along a section line B-B' in FIG. 13B. FIG. 13C is a schematic bottom view of the LED 100m in FIG. 13A, wherein the substrate 300, the first conductive layer 310 and the second conductive layer 320 are omitted from FIG. 13C. Referring to FIG. 13A, FIG. 13B and FIG. 13C, the LED 100m of the thirteenth exemplary embodiment has a structure similar to that of the LED 100e of the fifth exemplary embodiment. A difference between them lies in that a second electrode of the LED 100m is, e.g., a plurality of first sub-electrodes 152, and a third electrode is, e.g., a plurality of second sub-electrodes 162. Each of the second sub-electrodes 162 is connected to the first sub-electrode 152 corresponding thereto and the second conductive layer 320. The present exemplary embodiment includes four first sub-electrodes 152 disposed at, e.g., four corners on the first surface 112. Moreover, the second sub-electrodes 162 are disposed corresponding to the first sub-electrodes 152. In this way, a current is transmitted to the first sub-electrodes 152 through the second sub-electrodes 162 at the four corners, thereby reducing the chance of current crowding.

In a general LED, during the LLO process for removing the carrier substrate 200, rupture easily occurs at corners of the first semiconductor layer 110. Therefore in the present exemplary embodiment, when the second sub-electrodes 162 are disposed at the corners, due to support of the second sub-electrodes 162, the chance of rupture of the first semiconductor layer 110 is reduced. In this way, manufacturing yield of the LED 100*m* is increased. The present exemplary embodiment provides an example where the LED 100*m* is in a square shape and the LED 100*m* includes four first sub-electrodes 152 and four second sub-electrodes 162. However, the disclosure is not limited hereto. Depending on their needs, persons of ordinary skill in the art may design LEDs of different shapes, and arrange a plurality of first sub-electrodes and second sub-electrodes at corresponding edges or corners, and the above designs all fall within the scope of the disclosure for which protection is sought.

Figure 14A:
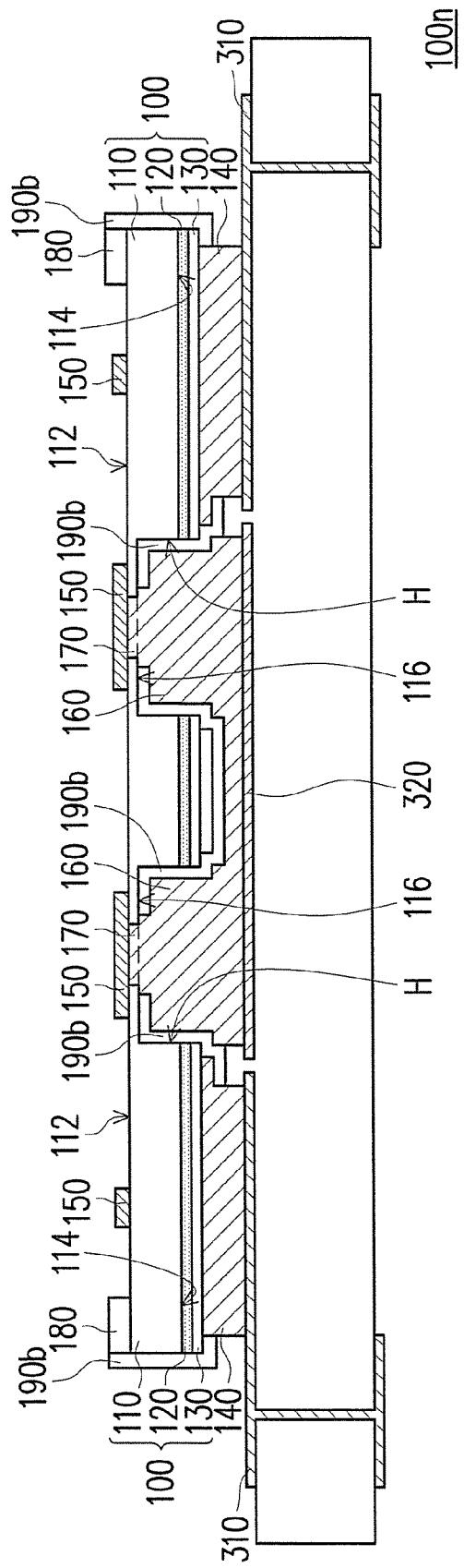
FIG. 14A is a schematic cross-sectional view of an LED according to the fourteenth exemplary embodiment.
Figure 14B:
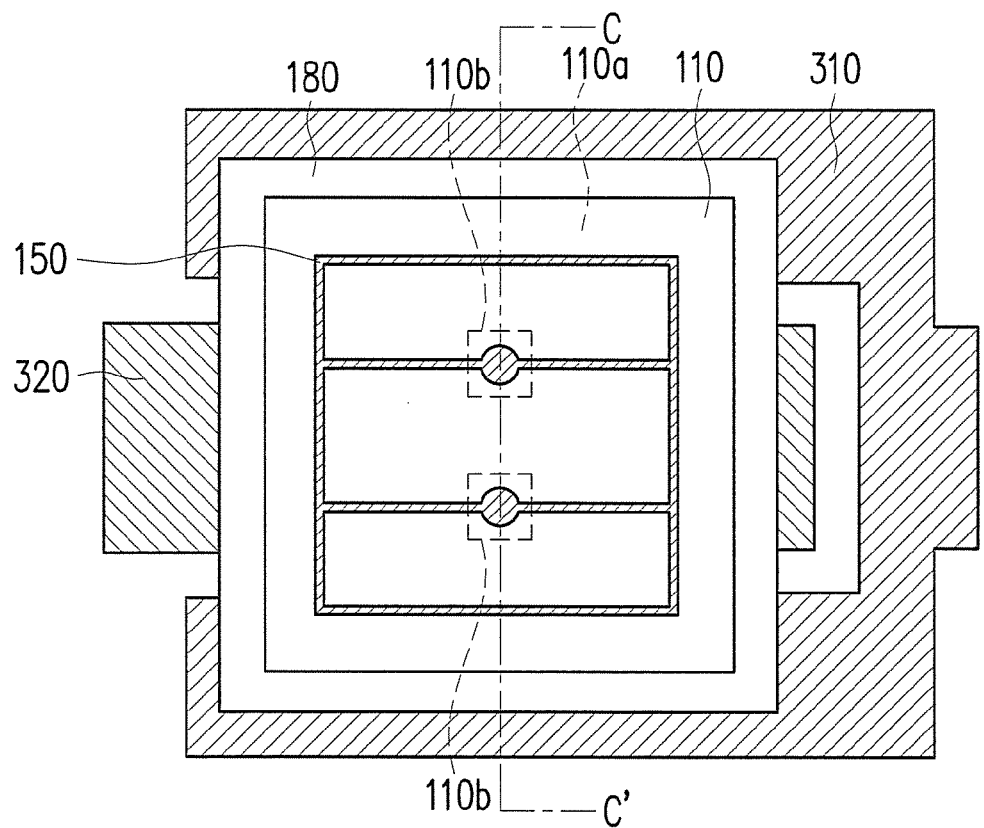
FIG. 14B is a schematic top view of the LED in FIG. 14A.
Figure 14C:
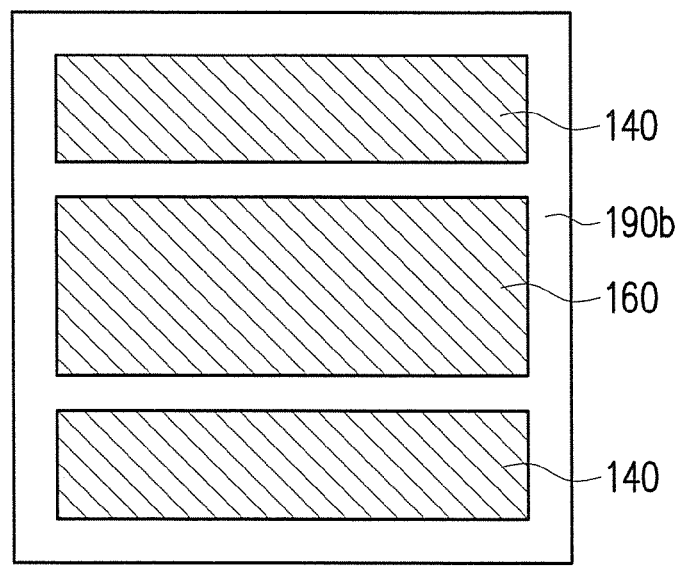
FIG. 14C is a schematic bottom view of the LED in FIG. 14A.

FIG. 14A is a schematic cross-sectional view of an LED according to the fourteenth exemplary embodiment. FIG. 14B is a schematic top view of an LED 100*n* in FIG. 14A, wherein the substrate 300 and the protection layer 190*b* are omitted from FIG. 14B, and FIG. 14A is a schematic cross-sectional view along a section line C-C' in FIG. 14B. FIG. 14C is a schematic bottom view of the LED 100*n* in FIG. 14A, wherein the substrate 300, the first conductive layer 310 and the second conductive layer 320 are omitted from FIG. 14C. Referring to FIG. 14A, FIG. 14B and FIG. 14C, the LED 100*n* of the fourteenth exemplary embodiment has a structure similar to that of the LED 100*e* of the fifth exemplary embodiment. A difference between them lies in that the second region 110*b* of the present exemplary embodiment is not located on the edge of the second surface 114. More specifically, the second region 110*b* of the present exemplary embodiment is surrounded by the first region 110*a*, and the first semiconductor layer 110 of the present exemplary embodiment includes two second regions 110*b*. The third electrode 160 is located on the third surface 116 of the opening H of the second region 110*b*. Moreover, the third electrode 160 is electrically connected to the second electrode 150 through the fourth electrode in the first semiconductor layer 110.

In the present exemplary embodiment, the third electrodes 160 in different second regions 110*b* are connected together. In addition, in the present exemplary embodiment, the protection layer 190*b* is disposed to reduce the possibility of the contact between the third electrode 160 and the light emitting layer 120. Of course, the number of the second regions 110*b* is not limited in the disclosure, and persons of ordinary skill in the art may set by themselves the number of contact positions between the third electrode 160 and the second electrode 150, depending on their needs.

Figure 15A:
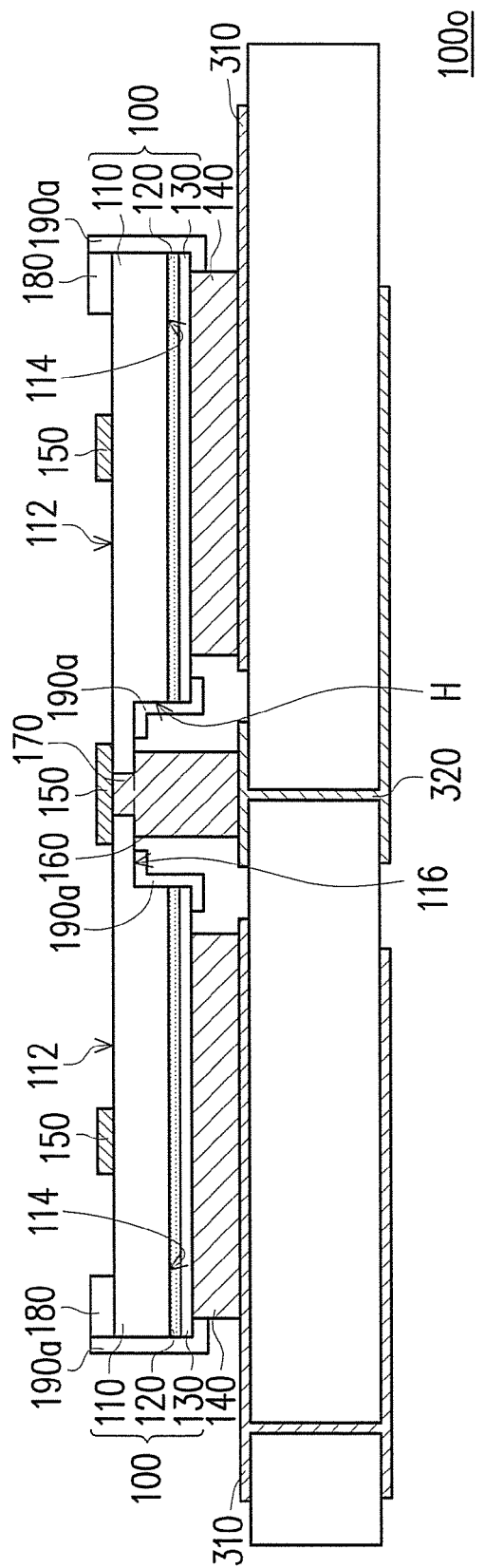
FIG. 15A is a schematic cross-sectional view of an LED according to the fifteenth exemplary embodiment.
Figure 15B:
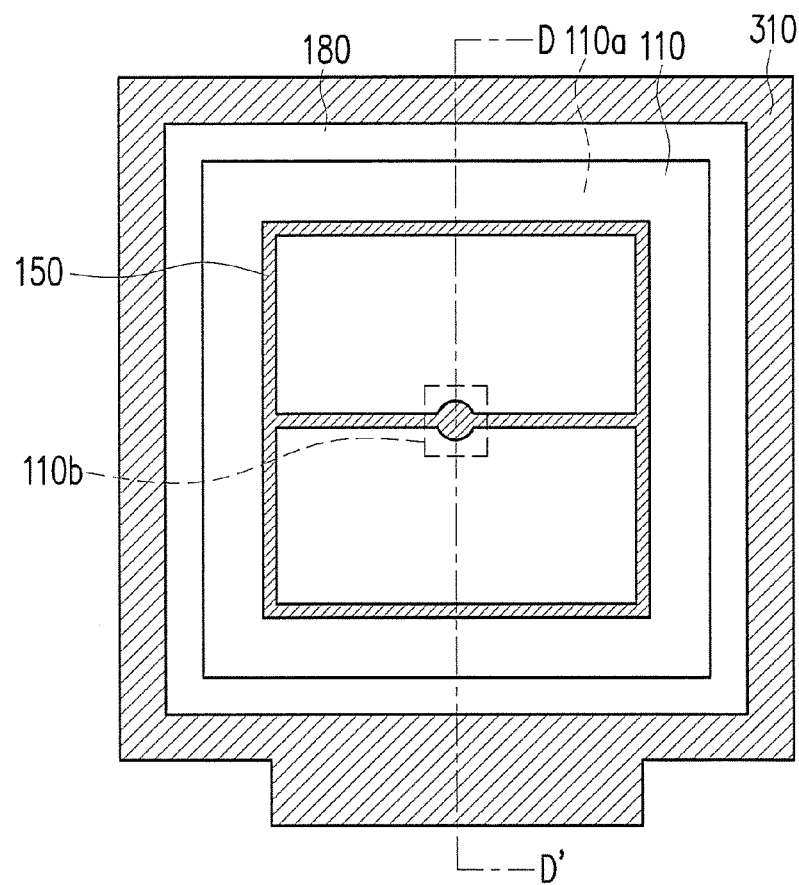
FIG. 15B is a schematic top view of the LED in FIG. 15A.
Figure 15C:
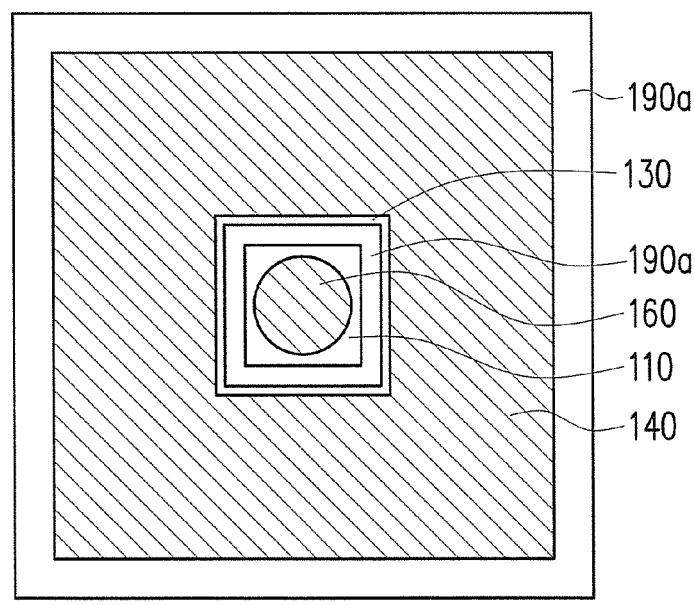
FIG. 15C is a schematic bottom view of the LED in FIG. 15A.

FIG. 15A is a schematic cross-sectional view of an LED according to the fifteenth exemplary embodiment. FIG. 15B is a schematic top view of an LED 100*o* in FIG. 15A, wherein the substrate 300 is omitted from FIG. 15B, and FIG. 15A is a schematic cross-sectional view along a section line D-D' in FIG. 15B. FIG. 15C is a schematic bottom view of the LED 100*o* in FIG. 15A, wherein the substrate 300, the first conductive layer 310 and the second conductive layer 320 are omitted from FIG. 15C. Referring to FIG. 15A, FIG. 15B and FIG. 15C, the LED 100*o* of the fifteenth exemplary embodiment has a structure similar to that of the LED 100*n* of the fourteenth exemplary embodiment. A difference between them lies in that the first semiconductor layer 110 of the present exemplary embodiment includes one second region 110*b*, and the second region 110*b* is located at, e.g., the center of the first semiconductor layer 110. In addition, the protection layer 190*a* is located between the third electrode 160 and the light emitting layer 120, and there is a gap between the protection layer 190*a* and the third electrode 160.

Figure 16:
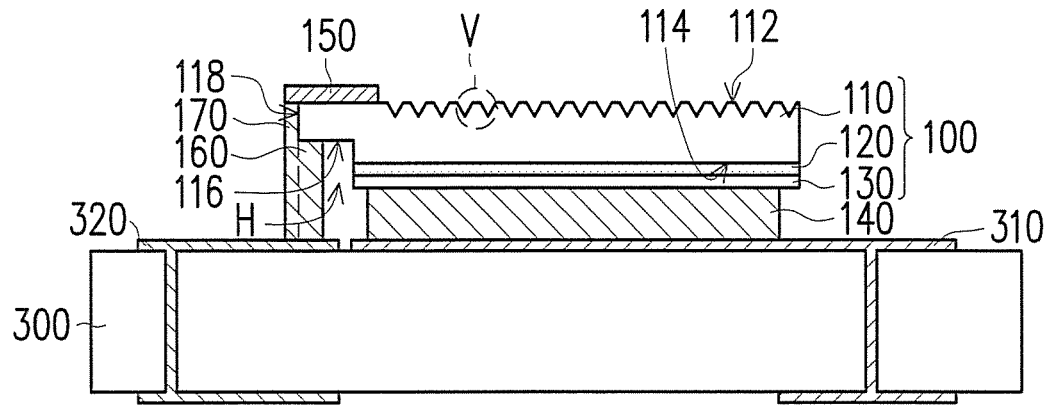
FIG. 16 is a schematic cross-sectional view of an LED according to the sixteenth exemplary embodiment.

FIG. 16 is a schematic cross-sectional view of an LED according to the sixteenth exemplary embodiment. Referring to FIG. 16, an LED 100*p* of the sixteenth exemplary embodiment has a structure similar to that of the LED 100*a* of the first exemplary embodiment. A difference between them lies in that in the LED 100*p* of the present exemplary embodiment, the first surface 112 of the first semiconductor layer 110 has a roughened structure V. The arrangement of the roughened structure V effectively enhances light emitting efficiency of the LED 100*p*.

Figure 17:
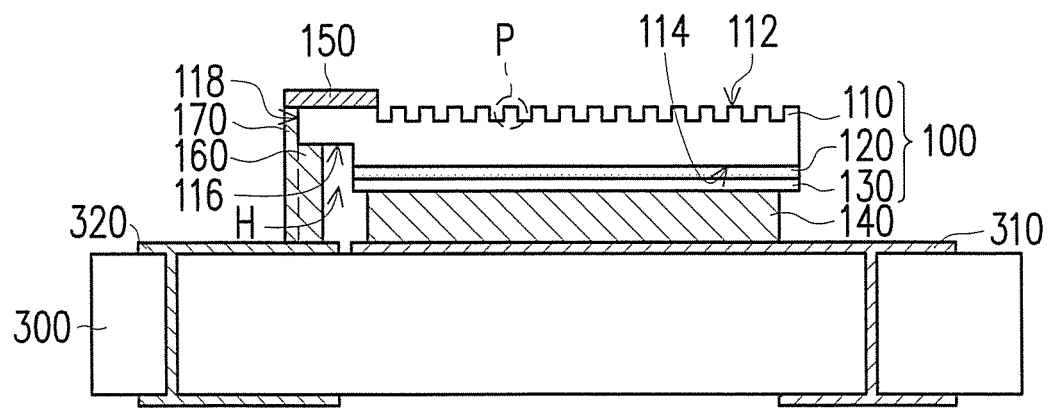
FIG. 17 is a schematic cross-sectional view of an LED according to the seventeenth exemplary embodiment.

FIG. 17 is a schematic cross-sectional view of an LED according to the seventeenth exemplary embodiment. Referring to FIG. 17, an LED 100*q* of the seventeenth exemplary embodiment has a structure similar to that of the LED 100*a* of the first exemplary embodiment. A difference between them lies in that in the LED 100*q* of the present exemplary embodiment, the first surface 112 of the first semiconductor layer 110 has a photonic crystal P. The arrangement of the photonic crystal P effectively enhances light emitting directivity of the LED 100*q*. Specifically, the photonic crystal P further decreases a light emitting angle of the LED 100*q*. Thus, a higher light utilization rate is achieved as compared to a conventional face-up LED.

Figure 18A:
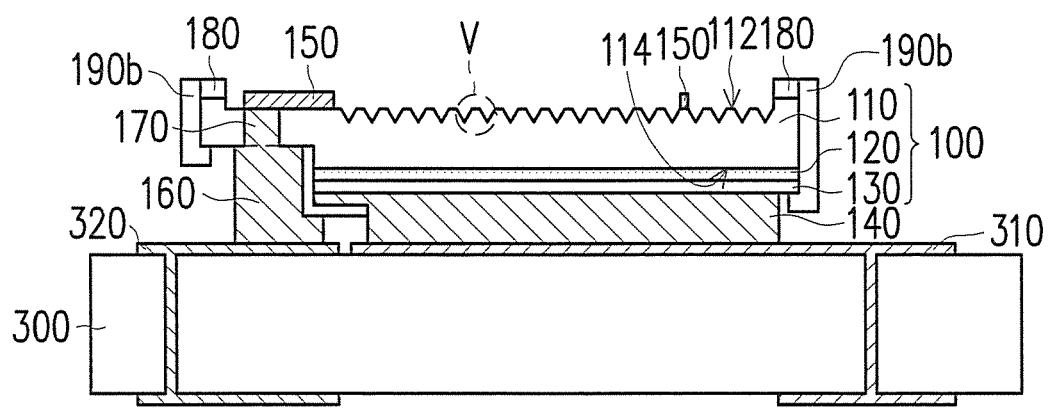
FIG. 18A is a schematic cross-sectional view of an LED according to the eighteenth exemplary embodiment.
Figure 18B:
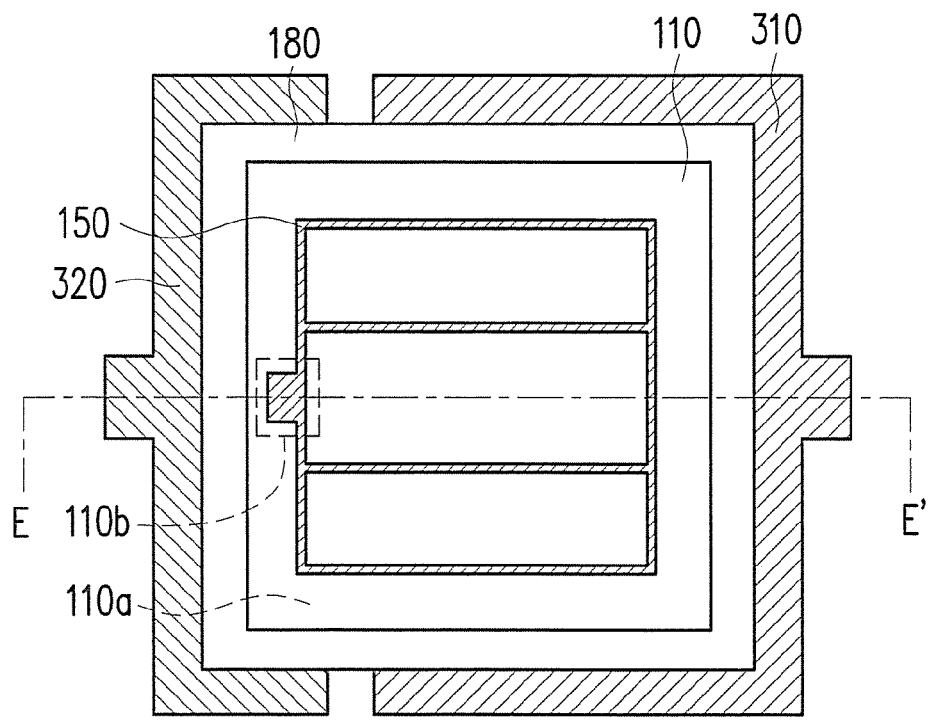
FIG. 18B is a schematic top view of the LED in FIG. 18A.
Figure 18C:
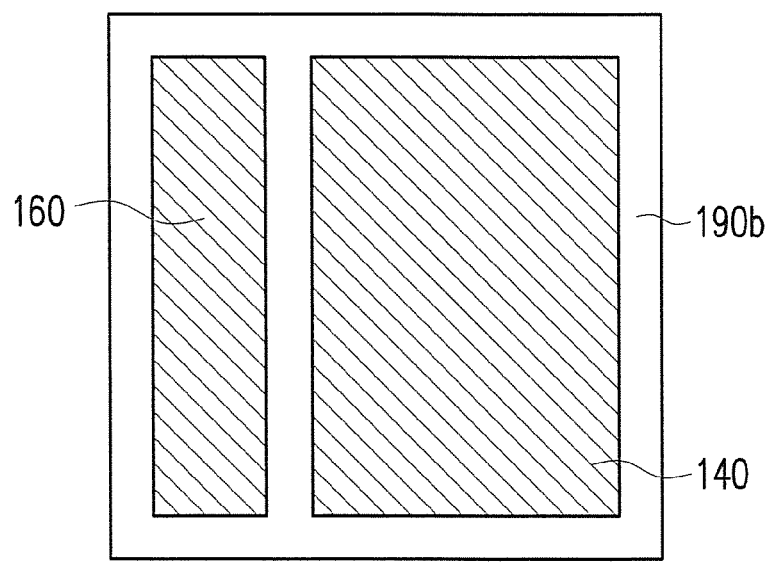
FIG. 18C is a schematic bottom view of the LED in FIG. 18A.

FIG. 18A is a schematic cross-sectional view of an LED according to the eighteenth exemplary embodiment. FIG. 18B is a schematic top view of the LED in FIG. 18A, wherein the substrate 300 and the protection layer 190*b* are omitted from FIG. 18B, and FIG. 18A is a schematic cross-sectional view along a section line E-E' in FIG. 18B. FIG. 18C is a schematic bottom view of the LED in FIG. 18A, wherein the substrate 300, the first conductive layer 310 and the second conductive layer 320 are omitted from FIG. 18C. Referring to FIG. 18A, FIG. 18B and FIG. 18C, an LED 100*r* of the eighteenth exemplary embodiment has a structure similar to that of the LED 100*e* of the fifth exemplary embodiment. A difference between them lies in that a connected part between the second electrode 150 and the fourth electrode 170 of the present exemplary embodiment is in the first semiconductor layer 110.

Specifically, during the fabrication, the third electrode 160 and the fourth electrode 170 are, e.g., formed in an opening (not illustrated) in the first semiconductor layer 110, and do not contact the undoped semiconductor layer 180. Accordingly, when the carrier substrate 200 is removed to be detached from the undoped semiconductor layer 180, the fourth electrode 170 is unlikely to fall off with the lift-off of the carrier substrate 200. Then, a dry etching process is performed to remove a portion of the undoped semiconductor layer 180 and a portion of the first semiconductor layer 110 (not illustrated), thereby exposing the fourth electrode 170 located in the first semiconductor layer 110. Next, the roughened structure V is formed on the first surface 112 of the first semiconductor layer 110, so as to enhance light emitting efficiency of the LED 100*r*. Next, the second electrode 150 is formed on the first surface 112 of the first semiconductor layer 110. In addition, the third electrode 160 of the present exemplary embodiment has a larger surface area (as shown in FIG. 18C), which is thus favorable for follow-on processes.

It is worth mentioning that the designs of the aforementioned exemplary embodiments may be combined with one another for designing an LED having good luminous efficacy. For example, the first electrode 140*a* of the ninth exemplary embodiment may be designed to have the same structure as the first electrode 140 of the first exemplary embodiment. Or, the structure of the first electrode 140 of the first to eighth exemplary embodiments may be the same as that of the first electrode 140a of the ninth exemplary embodiment. Persons of ordinary skill in the art may design a satisfactory LED according to their needs. It is to be noted that the various technical solutions designed as a result of combinations of the aforementioned exemplary embodiments all meet the spirit of the disclosure, and all fall within the scope of the disclosure for which protection is sought.

In summary, in the LED according to the disclosure, the semiconductor stacked structure is bonded to the conductive layer on the substrate by flip-chip bonding. Thus, problems such as uneven distribution of phosphor in a sealant and failure of the LED due to breakage of a bonding wire are unlikely to occur. Based on the above, the LED according to the disclosure has good device reliability.

In addition, in the LED according to the disclosure, the second surface of the first semiconductor layer has an opening for disposing the third electrode, and there is a gap between the third electrode and the light emitting layer. Therefore, there is no need to dispose an additional insulating layer between the third electrode and the light emitting layer for electrically isolating the third electrode and the light emitting layer from each other.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A light emitting diode, comprising:
   a semiconductor stacked structure, comprising:
      a first semiconductor layer comprising a first surface and a second surface opposite to each other, the first semiconductor layer comprising a first region and a second region;
      a second semiconductor layer disposed on the second surface and located in the first region; and
      a light emitting layer disposed between the first semiconductor layer and the second semiconductor layer;
   a substrate disposed opposite to the semiconductor stacked structure and toward the second surface, wherein the substrate has a first conductive layer and a second conductive layer thereon;
   a first electrode disposed between the second semiconductor layer and the first conductive layer;
   a second electrode disposed on the first surface;
   a third electrode at least located in the second region and at least a part of the third electrode disposed between the first semiconductor layer and the second conductive layer, the third electrode being electrically connected to the second electrode; and
   a fourth electrode disposed on a sidewall of the first semiconductor layer outside of the second region and connected to the second electrode and the third electrode.

2. The light emitting diode according to claim 1, wherein the second region comprises an opening extending from the second surface to the first surface, and a bottom of the opening is a third surface, wherein the third electrode is disposed on the third surface.

3. The light emitting diode according to claim 1, wherein the second region is located on an edge of the second surface.

4. The light emitting diode according to claim 1, wherein the second region is completely surrounded by the first region.

5. The light emitting diode according to claim 1, further comprising a fourth electrode disposed in the first semiconductor layer and connected to the second electrode and the third electrode.

6. The light emitting diode according to claim 1, further comprising a protection layer disposed between the second semiconductor layer and the third electrode.

7. The light emitting diode according to claim 1, further comprising a protection layer disposed between the first semiconductor layer and the fourth electrode.

8. The light emitting diode according to claim 2, wherein an area of the second region is smaller than or equal to 13% of a total area of the first region and the second region.

9. The light emitting diode according to claim 1, further comprising a protection layer disposed on a sidewall of the opening and on the second semiconductor layer around the opening.

10. The light emitting diode according to claim 1, further comprising an undoped semiconductor layer disposed on an edge of the first surface and surrounding the first surface, the second electrode being disposed on the undoped semiconductor layer and the first surface.

11. The light emitting diode according to claim 1, further comprising at least one island structure disposed in the second region, the island structure having a top surface coplanar with a top surface of the second semiconductor layer, the third electrode being disposed between the island structure and the second region, wherein the island structure consists of the first semiconductor layer, the light emitting layer and the second semiconductor layer.

12. The light emitting diode according to claim 1, wherein the first electrode comprises:
   a mirror layer disposed on the second semiconductor layer;
   a barrier layer covering the mirror layer; and
   a bonding layer disposed on the barrier layer.

13. The light emitting diode according to claim 12, further comprising a protection layer disposed on a sidewall of the opening, the second semiconductor layer around the opening and the barrier layer, a portion of the third electrode being located on the protection layer.

14. The light emitting diode according to claim 1, wherein a sidewall of the first semiconductor layer is an inclined plane.

15. The light emitting diode according to claim 1, further comprising a ring-shaped electrode, wherein the second region surrounds the light emitting layer, and the ring-shaped electrode is disposed in the second region.

16. The light emitting diode according to claim 1, wherein the second electrode comprises a plurality of first sub-electrodes, the third electrode comprises a plurality of second sub-electrodes, and each of the second sub-electrodes is connected between the corresponding first sub-electrode and the corresponding second conductive layer.

17. The light emitting diode according to claim 1, further comprising a roughened structure disposed on the first surface.

18. The light emitting diode according to claim 1, further comprising a photonic crystal disposed on the first surface.

19. The light emitting diode according to claim 1, wherein the semiconductor stacked structure has a thickness of less than 20 µm.

* * * * *